United States Patent [19]

Santhanam et al.

[11] Patent Number: 5,325,747
[45] Date of Patent: Jul. 5, 1994

[54] METHOD OF MACHINING USING COATED CUTTING TOOLS

[75] Inventors: Anakkavur T. Santhanam, Monroeville; Rajendra V. Godse, Greensburg; Dennis T. Quinto, Greensburg; Kenneth E. Undercoffer, Greensburg; Prem C. Jindal, Greensburg, all of Pa.; Roger A. Baillargeon, Enfield, Conn.; William D. Ewald, Raleigh, N.C.

[73] Assignee: Kennametal Inc., Latrobe, Pa.

[21] Appl. No.: 929,625

[22] Filed: Aug. 13, 1992

Related U.S. Application Data

[63] Continuation-in-part of Ser. No. 751,910, Aug. 29, 1991, Pat. No. 5,232,318, which is a continuation-in-part of Ser. No. 583,889, Sep. 17, 1990, abandoned.

[51] Int. Cl.$^5$ .................... B23B 1/00; B23B 27/16
[52] U.S. Cl. ............................ 82/1.11; 407/119
[58] Field of Search ............. 82/1.11; 407/119; 51/295, 307, 309

[56] References Cited

U.S. PATENT DOCUMENTS

| | | | |
|---|---|---|---|
| 3,755,866 | 9/1973 | Ohlsson | 407/119 |
| 3,882,579 | 5/1975 | Peacock | 407/119 |
| 3,955,038 | 5/1976 | Lindstrom et al. | 407/119 X |
| 4,035,541 | 7/1977 | Smith et al. | 428/217 |
| 4,101,703 | 7/1978 | Schintlmeister | 428/216 |
| 4,268,569 | 5/1981 | Hale | 407/119 X |
| 4,402,994 | 9/1983 | Kobayashi et al. | 427/38 |
| 4,426,267 | 1/1984 | Munz et al. | 204/192 |
| 4,448,802 | 5/1984 | Buhl et al. | 427/42 |
| 4,449,989 | 5/1984 | Sarin et al. | 51/295 |
| 4,497,874 | 2/1985 | Hale | 428/551 |
| 4,610,931 | 9/1986 | Nemeth et al. | 428/547 |
| 4,640,869 | 2/1987 | Loth | 428/469 |
| 4,686,156 | 8/1987 | Baldoni, II et al. | 428/698 |
| 4,708,037 | 11/1987 | Buljan et al. | 82/1 C |
| 4,720,437 | 1/1988 | Chudo et al. | 428/698 |
| 4,770,946 | 9/1988 | Yamauchi et al. | 428/469 |
| 4,776,863 | 10/1988 | Van Den Berg et al. | 51/295 |
| 4,828,612 | 5/1989 | Yohe | 73/238 |
| 4,902,395 | 2/1990 | Yoshimura | 204/192.3 |
| 4,966,501 | 10/1990 | Nomura et al. | 407/119 |
| 4,984,940 | 1/1991 | Bryant et al. | 407/119 |
| 5,075,181 | 12/1991 | Quinto et al. | 428/698 |
| 5,232,318 | 8/1993 | Santhanam et al. | 407/119 |
| 5,250,367 | 10/1993 | Santhanam et al. | 428/698 |
| 5,266,388 | 11/1993 | Santhanam et al. | 428/212 |

FOREIGN PATENT DOCUMENTS

| | | |
|---|---|---|
| 0166708 | 1/1986 | European Pat. Off. |
| 0191554 | 8/1986 | European Pat. Off. |
| 0149024 | 2/1987 | European Pat. Off. |
| 0385283A2 | 9/1990 | European Pat. Off. |
| 148349 | 5/1981 | German Democratic Rep. |
| 53-025282 | 3/1978 | Japan |

(List continued on next page.)

OTHER PUBLICATIONS

Siekmann, H. Jack, "How to Machine Titanium," The Tool Engineer, Jan. 1955, pp. 78-82.

Dearnley, P. A., et al., "Evaluation of Principal Wear Mechanisms of Cemented Carbides and Ceramics Used for Machining Titanium Alloy IMI 318," Materials Science and Technology, Jan. 1986, vol. 2, pp. 47, 47-58.

Machado, A. R., et al., "Machining of Titanium and Its Alloys-a Review," Proc. Instn. Mech. Engrs., vol. 204 (1990) pp. 53-60.

Metals Handbook, Ninth Edition, vol. 16, "Machining" (1989) pp. 736-760, 844-857.

(List continued on next page.)

Primary Examiner—William E. Terrell
Attorney, Agent, or Firm—John J. Prizzi

[57] ABSTRACT

Provided is a coated cutting tool having a coating and a substrate. The coating includes at least one CVD layer which may have a residual tensile stress and at least one layer having a high residual compressive stress. The outermost layer of the coating is preferably the one containing residual compressive stresses. The substrate is a composite having hard refractory grains. The cutting tool has been found to be particularly useful in the machining of titanium alloys and superalloys.

18 Claims, 1 Drawing Sheet

FOREIGN PATENT DOCUMENTS

| | | |
|---|---|---|
| 54-010491 | 1/1979 | Japan . |
| 54-073392 | 6/1979 | Japan . |
| 9038755 | 11/1979 | Japan . |
| 78158372 | 3/1981 | Japan . |
| 61-52541 | 11/1981 | Japan ................................. 407/119 |
| 50798670 | 6/1982 | Japan . |
| 57-192259 | 11/1982 | Japan . |
| 57-192260 | 11/1982 | Japan . |
| 59-1874 | 4/1984 | Japan . |
| 62-009808 | 1/1987 | Japan . |
| 62-56564 | 3/1987 | Japan . |
| 62-192576 | 8/1987 | Japan . |
| 62-214166 | 9/1987 | Japan . |
| 62-270764 | 11/1987 | Japan . |
| 01104773 | 4/1989 | Japan . |
| 01183310 | 7/1989 | Japan . |
| 02030406 | 1/1990 | Japan . |
| 0071906 | 3/1990 | Japan ................................. 407/119 |
| 02-109619 | 4/1990 | Japan . |

OTHER PUBLICATIONS

"Kennametal/81 Milling Cutters for Greater Productivity," Catalogue No. A80–105(75)HO (1980) pp. 1–92.

Torok et al., "Young'Modulus of TiN, TiC, ZrN, and HfN," Thin Solid Films, 153 (1987) pp. 37–43.

Jindal et al., "Adhesion Measurement of Chemically Vapor Deposited Hard Coatings on WC–Co Substrates," Thin Solid Films, vol. 54 (1987) pp. 361–375.

Rickerby et al., "Correlation of Process System Parameters with Structure & Properties of Physically Vapour–Deposited Hard Coatings," Thin Solid Films, vol. 157 (Feb. 1988) pp. 195–222.

Jindal et al., "Load Dependence of Microhardness of Hard Coatings," Surface & Coatings Technology, vol. 36 (1988) pp. 683–694.

Quinto et al., "High Temperature Microhardness of Hard Coatings Produced by Physical & Chemical Vapor Deposition," Thin Solid Films, vol. 153 (1987) pp. 19–36.

Bonetti et al., "CVD of Titanium Carbonitride at Moderate Temperatures," Surface Modification Technologies III (1990) Proceedings held in Switzerland Aug. 28–Sep. 1, 1989, pp. 291–308.

Dearnley et al., "Evaluation of Failure Mechanisms of Ceramics & Coated Carbides Use for MachiningStainless Steels," Surface Engineering, vol. 2, No. 3 (1986) pp. 191–202.

Wolfe et al., "The Role of Hard Coatings in Carbide Milling Tools," J. Vac. Sci. Technol., A3 (1986) pp. 2747–2754.

American National Standard for Cutting Tools–Indexable Inserts–Identification (ANSI) B212.4–1986.

"Kennametal Tooling Applications Program–Turning Applications Workbook" (1990) pp. 3, 39–43.

Japanese Industrial Standard JIS B4053 (1987) "Applications of Carbides for Machining by Chip Removal Designation".

Japanese Industrial Standard JIS B4104 (1978) "Cemented Carbide Tips".

International Standard ISO–R513–1975(E) "Application of Carbides for Machining by Chip Removal–Designation of the Main Groups of Chip Removal and Groups of Application".

"Mill with Coated Inserts? Sure!" Modern Machine Shop, Oct. 1987, pp. 52–59. Ken Gettelman, Editor, Interview with James L. Hunt.

Santhanam, A. T., et al., "Innovations in Coated Carbide Cutting Tools," Metal Powder Report, vol. 42, No. 12, Dec. 1987, pp. 840–845.

Sarin, V. K., "Cemented Carbide Cutting Tools," Advances in Powder Technology, Material Science Seminar, Louisville, Kentucky, ed. by G. Y. Chin (1981) pp. 253–288.

Quinto et al., "Mechanical Properties, Structure & Performance of Chemically Vapour–Deposited & Physically Vapor Deposited Coating Carbide Tools," Materials Sci. & Eng., A105/A106 (1980) pp. 443–452.

Quinto, "Mechanical Property & Structure Relationships in Hard Coatings for Cutting Tools," J. Vac. Sci. Technol. A6(3), May/Jun. 1988, pp. 2149–2157.

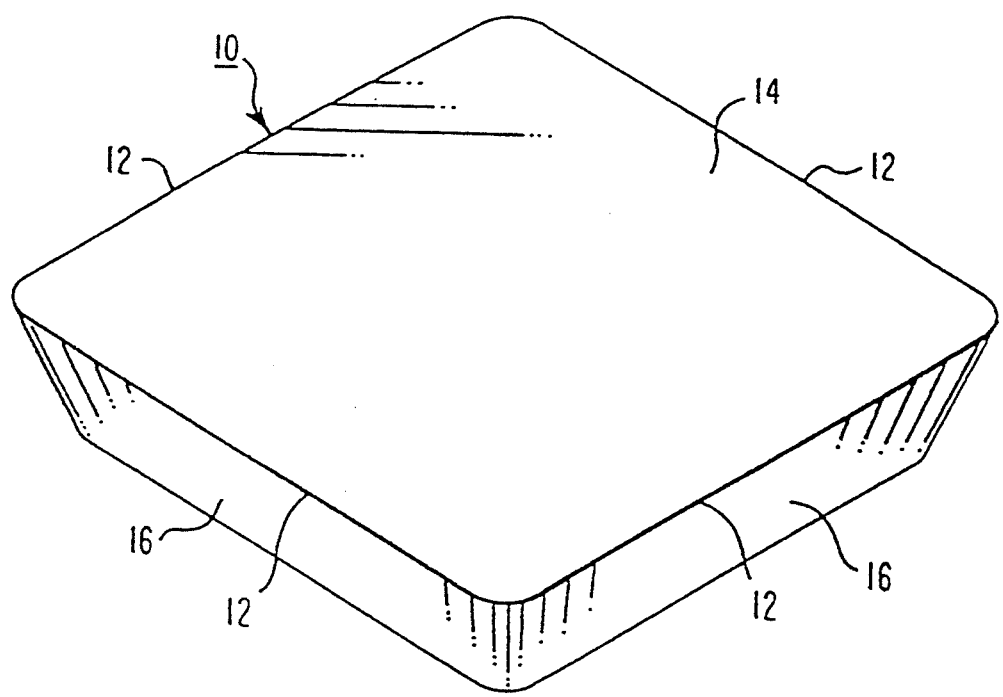

METHOD OF MACHINING USING COATED CUTTING TOOLS

This is a continuation-in-part of copending application Ser. No. 07/751,910, filed on Aug. 29, 1991, now U.S. Pat. No. 5,232,318, which was a continuation-in-part of copending application Ser. No. 07/583,889, filed on Sep. 17, 1990, abandoned.

BACKGROUND OF THE INVENTION

The present invention relates to the field of coated hard refractory substrates, especially cutting tools.

In the past, cemented carbide cutting tools have been used in both a coated and an uncoated condition to machine metals and alloys. The application of a coating having one or more layers of a refractory material to a tungsten carbide-cobalt cemented carbide substrate has been used to improve the wear resistance and application range of cemented carbide cutting tools. In the past, refractory coatings, such as TiC, TiCN, TiN, and $Al_2O_3$, have been applied by CVD (chemical vapor deposition) techniques. In addition, TiN coatings have been applied by PVD (physical vapor deposition) techniques. Such CVD coatings deposited on cemented carbide substrates are characterized by thermal cracks, and residual tensile stresses. PVD TiN coatings are characterized by a dense, pore free structure without thermal cracks, and may have residual compressive stresses. The application of CVD coatings to cemented carbide substrates results in a reduction in the transverse rupture strength of the insert and, therefore, produces a greater susceptibility to chipping and breakage during use.

Titanium alloys are particularly difficult to machine due to the high degree of reactivity between the cutting tool and the hot metal chips which flow across it. Chipping and breakage of the cutting edge are significant problems in this application. One of the best tool materials to use to machine titanium is an uncoated cemented carbide grade of material (see substrate 2 described subsequently). However, because it is uncoated, its application range is limited to low speeds. Some improvements have been achieved by coating this substrate with a PVD TiN coating.

Other difficult to machine materials are the high temperature superalloys (iron, nickel and/or cobalt base). While ceramics have been used to rough machine these materials, final or finish machining is done by cemented carbides at low speeds. Cemented carbides are used for finishing machining because their high toughness makes them less likely to break or chip severely during machining. Such a failure might ruin the surface finish of expensive turbine or aircraft components, leading to expensive re-working or scrapping of the almost finished component. Advances in turbine and aircraft materials have led to new alloys which allow aircraft engines to operate at higher temperatures. Such materials (e.g., PWA-1074; IN-100) are highly abrasive and are extremely difficult to machine.

There is definitely a need for a new cutting tool material for machining these difficult to machine materials.

SUMMARY OF THE INVENTION

Applicants have now discovered that the transverse rupture strength of CVD coated cemented carbide may be improved by applying a PVD layer to the CVD coated substrate. In order to provide the aforementioned improvements, it is believed that the PVD coating must contain residual compressive stresses.

Therefore, in accordance with the present invention, improved cutting tools are provided having a substrate coated with one or more CVD layers, which may have a residual tensile stress, and one or more layers having a residual compressive stress. The outermost layer is preferably one having residual compressive stresses. Preferably, the compressive residual stress in the outermost layer exceeds 60 $kg/mm^2$, and more preferably, exceeds 130 $kg/mm^2$. In PVD TiN coatings, the compressive residual stress is preferably between about 60 to 340 $kg/mm^2$, and preferably, about 130 to 270 $kg/mm^2$. The substrate is a composite material having hard refractory grains (e.g., WC), preferably bonded together by a binder material, preferably, metallic (e.g., Co).

In accordance with one preferred embodiment of the present invention designed for machining titanium alloys and high temperature superalloys, the cemented carbide substrate consists essentially of tungsten carbide and a metallic binder. The metallic binder content is preferably 3-10 weight percent, more preferably 5-7 weight percent, and most preferably 5.7-6.3 weight percent. The solid solution carbide forming elements, Ti, Zr, Hf and Nb, are preferably not used and are present only as impurities. The metallic binder is selected from the group consisting of cobalt and cobalt alloys. The average grain size of the tungsten carbide is preferably about 1 to 5 μm. Small amounts of a grain growth control agent may be added, such as Ta, V and/or Cr. The substrate is preferably an A and/or B porosity with a magnetic saturation of 80 to 90 percent for high temperature deformation resistance. The substrate is refractory coated with an inner CVD layer and PVD layer as described above.

This insert is preferably used in titanium alloy and high temperature alloy machining (e.g., nickel, iron and/or cobalt base superalloys) at speeds in excess of 300 surface feet/minute, and more preferably about 400 or more surface feet/minute.

These and other aspects of the present invention will become more apparent upon review of the detailed specification in conjunction with the FIGURE which is briefly described below:

BRIEF DESCRIPTION OF THE DRAWINGS

The FIGURE shows an isometric view of an embodiment of a cutting tool in accordance with the present invention.

DETAILED DESCRIPTION OF THE INVENTION

In accordance with the present invention, the FIGURE shows a preferred embodiment of an indexable cutting insert 10 having cutting edges 12 at the junction of rake face 14 with flank faces 16. The cutting insert 10 shown in the FIGURE is an SPGN-433 (ANSI B212.4-1986) which may be in a sharp, or preferably, honed cutting edge condition.

In a first preferred embodiment, the substrate is a WC based cemented carbide substrate containing at least 70 weight percent WC, and more preferably, at least 80 weight percent WC. The binder is preferably cobalt or a cobalt alloy and, preferably, has a bulk concentration of 5 to 15 weight percent. More preferably, the bulk cobalt content is about 7 to about 13 weight percent, and most preferably, about 8 to about 12 weight percent. The substrate may also preferably contain solid solution carbide forming elements such as Ti, Hf, Zr, Nb, Ta, V, preferably selected from Ti, Nb and Ta alone or in combination with each other. These elements preferably may be added to the mix as an element, alloy, carbide, nitride or carbonitride. Preferably, the concentration of these elements is as follows: Ta 0–12 w/o; Ti 0–10 w/o and Nb 0–6 w/o. More preferably, the sum of Ta plus Nb is between about 3 to about 7 w/o and the titanium content is between about 0.5 to 10 w/o. Most preferably, the titanium content is about 1.5 to 4.0 w/o. These elements form solid solution carbides with the WC in the substrate. Chromium, preferably as $Cr_3C_2$, may also be added in small amounts, about 0.3–1.0 w/o.

In accordance with a second preferred embodiment, the substrate is a WC based cemented carbide containing at least 85 weight percent WC, and more preferably at least 90 weight percent WC. The binder is preferably cobalt or a cobalt alloy and has a bulk concentration of 3–10 weight percent. More preferably, the cobalt content is about 5–7 weight percent, and most preferably about 5.7–6.3 weight percent. The substrate should not contain any of the solid solution carbide forming elements, Ti, Hf, Zr, and Nb, except that they may be present as impurities, i.e., each element is present at no more than 0.4 w/o, and more preferably no more than 0.1 w/o. These solid solution carbide forming elements are not desired in this embodiment, since they act to reduce the $K_{Ic}$ fracture toughness of the substrate. Chromium, as a chromium carbide, vanadium (as vanadium carbide), and/or tantalum (as tantalum carbide), preferably, may be added in small amounts to help control the grain size of the WC and as an alloying element in the binder. Cr preferably is present at a level of about 0.3–1.0 w/o, and more preferably 0.3–0.5 w/o. V and Ta may be added at levels of 0.1–0.5 w/o and 0.2–2.0 w/o, respectively, and preferably at levels of 0.1–0.3 w/o and 0.5–1.0 w/o, respectively. The average WC grain size of the substrate is about 1–5 $\mu$m. The substrate may have A and/or B porosity and has a low magnetic saturation value, preferably 80–90 percent. The inventors believe that low magnetic saturation will provide improved high temperature deformation resistance to this embodiment of the substrate.

Bonded on to either of the above substrate embodiments is a hard refractory coating having at least two layers, preferably a CVD layer and preferably a PVD layer, with the last PVD layer preferably being outside the last CVD layer. Applicants have found that, when the PVD layer also has a compressive residual stress, that the transverse rupture strength of the CVD coated article is significantly improved.

In a preferred embodiment, the inner CVD layer is preferably a refractory nitride, such as Ti, Zr or Hf nitride. Nitrides are preferred over refractory carbides or carbonitrides for the inner layer adjacent to the substrate in order to minimize the formation of eta phase ($Co_3W_3C$ and/or $Co_6W_6C$) at the cemented tungsten carbide based substrate peripheral boundary. Eta phase is a brittle phase which may make the cutting edge more susceptible to chipping. A second layer in the coating is preferably a CVD refractory carbonitride, carbide, boride or boronitride, such as Ti, Zr or Hf carbonitride, carbide, boride or boronitride, because of the higher hardness and abrasion resistance of the carbides and carbonitrides, borides and boronitrides of Ti, Zr and Hf compared to their nitrides. The CVD second layer and any additional CVD layers may include, for example, alumina, either as a single layer or multiple layers separated from each other by a layer of another refractory material, such as a nitride, carbonitride or carbide of Ti, Hf or Zr, preferably, Ti.

The CVD layer, or layers, typically has a residual tensile stress when applied to tungsten carbide based cemented carbides. However, CVD layers with low levels of residual compressive stress may be produced by using a CVD process such as the moderate temperature process described in Bonetti et al., "CVD of Titanium Carbonitride at Moderate Temperature: Properties and Applications," Proceedings of Surface Modification Technologies III Conference—Switzerland, Aug. 28–Sep. 1, 1989, TMS, 1990, Pages 291–308, to apply CVD TiCN. Alternatively, using conventional CVD procedures, HfN may be applied having low level residual compressive stresses.

Where it is desired to have an $Al_2O_3$ CVD layer immediately beneath the outer PVD layer, it is preferred, in order to improve the bond strength between the $Al_2O_3$ and the PVD layer that an electrically conductive layer of CVD nitride, carbonitride or carbide layer of Ti, Hf or Zr is deposited between the alumina CVD layer and the PVD layer.

The final and outermost layer of the coating is preferably a hard refractory PVD layer, such as a nitride or carbonitride of Ti, Zr, Hf, and their alloys with each other, Ti-Al alloys, Ti-V alloys, chromium carbide, chromium nitride, or boron carbide. This outermost layer is characterized by residual compressive stresses.

It should be understood that, while not a preferred option, the present invention may, however, include within its scope cutting tools having a CVD or other layer outside of the outermost PVD layer so long as the outermost layer is not deposited at a temperature which significantly reduces the residual compressive stresses in the PVD layer, thereby reducing the chipping resistance of the cutting tool.

The present invention is further illustrated by the following examples which are provided purely for illustration and not limitation.

The effect of coatings on the transverse rupture strength of cemented carbide substrate was demonstrated by applying the following coatings on a conventional WC-6 weight percent cobalt-0.5 weight percent $Cr_3C_2$ cemented carbide substrate.

Coatings

1. CVD {TiN (1 $\mu$m)/TiCN (3 $\mu$m)/TiN (4 $\mu$m)}
2. CVD {TiN (1 $\mu$m)/TiCN (3 $\mu$m)}/PVD TiN (4 $\mu$m)
3. PVD TiN (8 $\mu$m)

The CVD coatings were applied by conventional CVD techniques at about 950 to 1000 degrees Centigrade. The PVD TiN coating was applied with a Balzers BAI-830 (Balzers AG, Liechtenstein) ion plating PVD coating unit at about 500 degrees Centigrade using a titanium source and a nitrogen atmosphere (see U.S. Pat. No. 4,448,802). As is common practice during the initial stages of coating a very thin layer (detectable by high resolution TEM) of titanium was deposited on the CVD TiCN layer to provide improved adhesion between it and the PVD-TiN layer. The PVD layer produced by this technique has compressive residual stresses.

The transverse rupture strength of transverse rupture bars coated as described above and in an uncoated condition were measured using the ASTM standard B406 transverse rupture test procedure. The transverse rupture strength data are given below in Table I.

TABLE I

|  | Average TRS (ksi) | Standard Deviation (ksi) |
|---|---|---|
| Uncoated | 559 | 27 |
| Coating 1 (CVD) | 193 | 12 |
| Coating 2 (CVD + PVD) | 281 | 11 |
| Coating 3 (PVD) | 566 | 58 |

As shown by the examples, the application of CVD layers to a cemented carbide substrate results in a drastic decrease in transverse rupture strength. This reduction is believed to be due to: (a) the high temperature annealing effect of the CVD deposition temperature (950–1000 degrees Centigrade) which reduces beneficial compressive residual stresses in the surface due to grinding of the cemented carbide substrate; and (b) the presence of thermal cracks and residual tensile stresses in the CVD layers caused by thermal expansion mismatch between the coating and the cemented carbide substrate.

The deposition of PVD TiN over the CVD {TiN/TiCN} partially restores the loss in TRS observed with CVD coating alone. This improvement (about 45 percent) in TRS is believed to be due to the presence of compressive residual stresses and the absence of thermal cracks within the outer PVD TiN layer.

It, therefore, follows that a coating of solely PVD should not degrade transverse rupture properties. This is shown by the results of the samples coated with coating 3.

Specific examples of cemented carbide substrates where the present invention may be applied are as follows:

| Substrate 1 | 11.5 w/o Co, 2.5 w/o Ta (Nb)C, 86 w/o WC - 89.8 $R_A$, Hc 160 Oe, A and/or B porosity |
|---|---|
| Substrate 2 | 6.0 w/o Co, 0.5 w/o $Cr_3C_2$, 93.5 w/o WC - 93 $R_A$, Hc 300 Oe, A and/or B porosity (used in Table I examples) |
| Substrate 3 | 9.75 w/o Co, 90.25 w/o WC - 91 $R_A$, Hc 200 Oe, A and/or B porosity |
| Substrate 4 | 10 w/o Co, 90 w/o WC - 89 $R_A$, Hc 120 Oe, A and/or B porosity |
| Substrate 5 | 10.5 w/o Co, 10 w/o Ta(Nb)C, 7 w/o TiC, 72.5 w/o WC - 91.4 $R_A$, Hc 180 Oe, A and/or B porosity |
| Substrate 6 | 8.5 w/o Co, 11 w/o Ta(Nb)C, 7.5 w/o TiC, 73 w/o WC - 91.2 $R_A$, Hc 140 Oe, A and/or B porosity |

For further illustration, binder enriched substrates were made by the following procedures and then coated with various layers as described below to produce SPGN-433 style inserts.

The substrate powder was produced in a two stage milling procedure as illustrated in Table II In the first stage, the components were added to a four foot diameter by 5 foot long mill jar with 3400 kilograms of cemented tungsten carbide cycloids along with 130 gallons of heptane and milled for 18 hours to a Fisher Apparent Particle Size of 1.05 μm. The second stage components along with 95 gallons of heptane were then added and the mix was ball milled an additional 12 hours to a Fisher Apparent Particle Size of 1.05 μm.

TABLE II

|  | Material | Size | Weight % of Charge | Chemistry Weight % | | | | | |
|---|---|---|---|---|---|---|---|---|---|
|  |  |  |  | C | Co | Ta | Ti | Nb | W |
| Stage 1 | WC | −40 Mesh | 53.8 | 3.32 | 3.91 | 3.66 | 2.00 | 0.37 | Rem. |
|  | TiN | 1.3 μm | 2.0 | — | — | — | 1.50 | — | — |
|  | TaNbC | −40 Mesh | 1.7 | 0.13 | — | 1.09 | — | 0.48 | — |
| Stage 2 | Co | 1.5–2.0 μm | 2.1 | — | 2.10 | — | — | — | — |
|  | WC | 1.8–2.2 μm | 40.4 | 2.47 | — | — | — | — | Rem. |
|  | C |  | ≤.1 | .25 | — | — | — | — | — |
| TOTAL |  |  | 100 | 6.17 | 6.01 | 4.75 | 3.50 | 0.85 | Rem. |

Mill charge was then spray dried. SPGN-433 style insert substrates were then pressed and sintered. Sintering was performed at about 2650 degrees Fahrenheit for about 30 minutes under a vacuum. The resulting sintered substrates had their flank and rake faces ground, during which the binder enriched zone was removed. The cutting edges of some of the substrates were then honed, while in other substrates, the cutting edges were left in a sharp condition. The substrates were then resintered at 2650 degrees Fahrenheit for about 30 minutes in vacuum to again provide a cobalt enriched zone beneath both the flank and rake peripheral boundaries of the substrate. The base was then ground to insure flatness. The resulting substrates had a magnetic saturation value of 90 percent, indicating the absence of C type porosity, and a magnetic coercive force value, $H_c \approx 191$ oersted. Substrates of this type typically have a bulk hardness of about 92 Rockwell A and A-type porosity with possibly minor amounts of B-type porosity. Evaluation of the substrate by energy dispersive spectroscopy showed a binder enriched zone near a peripheral boundary of the substrate having a thickness of about 20 to 25 μm and having a maximum cobalt concentration averaging about 12.7 w/o or averaging about 200 to 210 percent of the bulk substrate concentration.

The substrates were then coated with the CVD and PVD layers described in the following examples. The CVD coating techniques used were conventional in nature. First, a CVD TiN layer was applied to the substrate, and then a CVD-TiCN layer was applied on top of the CVD TiN layer. These layers were deposited between 950 and 1000 degrees Centigrade.

After the CVD TiCN layer, all surfaces (i.e., the rake and flank surfaces) except for the bottom surface, were coated with a PVD layer of TiN as described before.

Residual stresses in the outermost TiN layer and in the WC of the substrate of the following inserts were analyzed:

1. Enriched substrate (made as described above)+CVD (TIN(1 μm)/TiCN(3 μm))+PVD TiN (4 μm)
2. Enriched substrate (made as described above)+CVD (TIN(1 μm)/TiCN(3 μm))/TIN(4 μm))

3. Nonenriched substrate B (see Table 3)+CVD (TiN(1 μm)/TiCN(3 μm))+PVD TiN (4 μm)
4. Nonenriched substrate B+CVD (TiN(1 μm)/TiCN(3 μm)/TiN(4 μm))

The $\sin^2 \psi$ method of residual stress measurement was performed on the rake face of a sample of each of the foregoing inserts. The $\psi$ angles used were as follows: 0, 21, 30, 38, 45, 52, −21, −30, −45, −52. All the data were collected on a Rigaku DMAX diffractometer with a stress measurement attachment (manufactured by Rigaku of OSAKA, Japan). Conventional peak fitting methods were used to analyze the x-ray diffraction peaks. The data were then fed into a Rigaku stress analysis program. In performing the analysis, the following mechanical properties were assumed: for WC—Poisson Ratio=0.2 and Young's Modulus=700 GPa; and for TiN—Poisson Ratio=0.2 and Young's Modulus=640 GPa. The peak reflections analyzed were the {211} reflection for WC and the {422} and {511} reflections for TiN. The residual stress was then calculated using a least squares fit to the peak data. This analysis showed that, where the outermost layer was a CVD TiN layer, it was under a residual tensile stress, but where the outermost layer was a PVD TiN layer, it was under a residual compressive stress. In all cases, the WC in the substrate had a residual compressive stress.

Additional residual stress measurements were made using the $\sin^2\psi$ method described above in order to provide a quantitative estimate of the levels of compressive and tensile stresses in the various coatings. These measurements are listed in Table III.

TABLE III

| SAMPLE NO. | RESIDUAL STRESS (in kg/mm²) | | |
|---|---|---|---|
|  | WC x σ | TiN x σ | TiCN x σ |
| 5. Enriched substrate CVD-TiN/TiCN/TiN[1] | 31.9 ± 6.6 compressive | 31.8 ± 1.4 tensile | 114 ± 43 tensile |
| 6. Enriched substrate CVD TiN/TiCN + PVD TiN[1] | 14.4 ± 5.1 compressive | 203 ± 70 compressive | 92.8 ± 6.3 tensile |
| 7. Nonenriched Substrate A CVD TiN/TiCN/TiN[1] | 5.7 ± 17.8 compressive | 71.1 ± 4.2 tensile | 65.6 ± 9.4 tensile |
| 8. Nonenriched Substrate A CVD TiN/TiCN-PVD-TiN[1] | 39.3 ± 21 compressive | 151 ± 40 compressive | 43.5 ± 12 tensile |
| 9. Nonenriched Substrate B PVD TiN (4 μm) | 85.7 ± 6.4 compressive | 293 ± 57 compressive | — |

[1]The TiN/TiCN/TiN coating layers have a thickness of 1 μm, 3 μm and 4 μm, respectively, with the innermost coating being 1 μm CVD TiN.
x is the residual stress measured from the slope of least squares fit to the peak data and σ = standard deviation.
For TiCN, the {422} reflection was analyzed. Poisson Ratio and Young's Modulus for TiCN were assumed to be 0.2 and 550 GPa, (interpolated value), respectively.
Substrate A ≈ WC based cemented carbide with 10.5 w/o Co, 7 w/o Ta, 5.5 w/o Ti, 2.5 w/o Nb, $R_A$ ≈ 91.4, Hc ≈ 180, A porosity.
Ta, 6 w/o Ti, $R_A$ ≈ 91.2, Hc ≈ 150, A porosity.

It should be noted that the stress measurements on TiN made in coatings which contain both a CVD and a PVD TiN layer is the result of contributions from both layers. Therefore, for Sample No. 6 in Table III, which is in accordance with the present invention, it can be said that the outer PVD TiN layer has a compressive residual stress in excess of about 203 kg/mm² since it is believed that the compressive residual stress value has been reduced by the innermost CVD TiN layer, which we believe to be under a residual tensile stress. However, it is believed that the contribution from the CVD TiN layer to this residual stress value is expected to be far less than that from the PVD layer, because the CVD layer, being deeper and thinner, is sampled less extensively by the incident x-ray beam. If the standard deviation is also considered, then it may be said that the compressive residual stresses in the outermost PVD TiN layer should preferably exceed about 60 kg/mm² (x−2σ), and more preferably, exceed about 130 kg/mm² (x−σ).

The magnitude of the upper limit on the actual stresses in the outermost PVD TiN layer of Sample No. 6 can be estimated by looking at Sample No. 9, which has only a PVD TiN layer and a compressive residual stress of 293±57 kg/mm² and by looking at Sample No. 5, which has two layers of CVD TiN and a tensile residual stress in these layers of 31.8±1.4 kg/mm². The inventors, therefore, believe it is reasonable to conclude that residual compressive stresses, of the outer PVD TiN layer, Sample No. 6, should be preferably between about 60 to 340 (x±2σ), and more preferably, between about 130 to 270 (x±σ) kg/mm².

It is also worth noting that, despite the high compressive residual stresses in the outer PVD TiN layer of Sample No. 6, the middle layer of CVD TiCN remains in a state of residual tensile stress.

CVD and PVD coated binder enriched substrates and other embodiments of the present invention are described in copending application U.S. Ser. No. 07/583,544 entitled "Binder Enriched CVD and PVD Coated Cutting Tool," filed on Sep. 17, 1990, now U.S. Pat. No. 5,250,367 and copending application U.S. Ser. No. 07/751,942, entitled "Binder Enriched Coated Cutting Tool filed on Aug. 29, 1991 now U.S. Pat. No. 5,266,388." These copending applications describe the application of these cutting inserts to milling of steel and shows the superiority of binder enriched grades over nonenriched grades in the severe milling applications described therein. The present applicants believe that, for less severe milling applications and turning applications, the application of compressive and tensile residual stress coatings to nonenriched substrates as described in the present application should be sufficient to provide improved chipping resistance.

Applicants have now surprisingly found that, when a second preferred embodiment described herein is coated as described in the Table I examples with a CVD and PVD coating, it provides excellent machining performance in the turning of titanium base alloys, such as Ti-6 Al-4V, and superalloys such as the nickel base superalloy Inconel-718, highly abrasive powder metal superalloys such as PWA-1074 and IN100. In these applications, performance has been found to be improved in that surface speed can be significantly increased compared with machining with the uncoated substrate, while either maintaining or significantly increasing tool life.

While this embodiment of the present invention may be used at any speed, it will be most efficiently used in machining titanium and nickel base alloys at speeds of about 300 sfm (surface feet/minute) or more, and more preferably about 400 sfm or more. Feed rates utilized should preferably be about 0.004 to about 0.015 inch/rev, with about 0.005–0.008 inch/rev. being more preferable. The depth of cut utilized is typically about 0.040–0.250 inches, and preferably 0.060–0.0150 inches for roughing applications.

In one example, PWA-1074, a powdered nickel base superalloy having a hardness of 44–46 Rockwell C was turned using the CVD-PVD coated insert of the type described in Table I, and using the same substrate (substrate 2) uncoated in the same style of insert (DNGP-542K). Both inserts had a sharp cutting edge. The insert in accordance with the present invention was used as 150 sfm (surface feet/minute), 0.005 ipr (inches/revolution) feed, and a DOC (depth of cut) of 0.10 inch. The uncoated insert was run at 87 sfm, 0.008 ipr feed, and 0.010 DOC. Both were used with a coolant. The insert in accordance with the present invention had made three cuts with only 0.009 inch flank wear, whereas the uncoated insert made only one cut with about 0.015 inch flank wear resulting. The same substrate was also tested and coated with only a PVD TiN coating at 120 sfm, 0.006 ipr and 0.010 inch DOC, with a sharp cutting edge and coolant, and was out-performed by the present invention by about two to one.

In another example, this time turning a Ti-6Al-4V alloy turbine hub, the Table I CVD-PVD coated substrate (substrate 2) was used on a CNGP-542 style insert at 420 sfm, 0.060–0.080 inch DOC and 0.005 ipr feed. Under these conditions, the invention had the same tool life as the uncoated substrate 2 being used at 210 sfm.

In another example, a Ti-6Al-4V disk was turned using a round style insert made of the Table I CVD-PVD coated material (substrate 2). The machining conditions were 400 sfm, 0.150 inch DOC and 0.008–0.010 ipr feed. Under these conditions, the tool in accordance with the present invention had twice the tool life of an uncoated substrate 2 used at 180 sfm.

In a test of the substrate used in the foregoing examples with the CVD-PVD coating according to the present invention, in one case, and a multilayer CVD coating in the other case, it was found that the insert having only CVD layers failed by chipping, whereas the insert in accordance with the present invention failed by the more predictable mode of flank wear when turning a Ti-6Al-4V alloy at 120 sfm under conditions involving interrupted cutting. At this speed, the life of the present invention was the same as that of the uncoated substrate.

All applications, patents and other documents referred to herein are hereby incorporated by reference.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A method of machining titanium alloys and high temperature superalloys comprising the steps of:
    machining an alloy selected from the group consisting of titanium alloys and high temperature superalloys at a predetermined speed with a cemented carbide cutting tool having a refractory coating;
    wherein said refractory coating has an inner CVD layer and an outer PVD layer;
    and wherein said cemented carbide consists essentially of tungsten carbide grains bonded together by a binder selected from the group consisting of cobalt and cobalt alloys;
    and wherein said cobalt forms about 3 to 10 weight percent of said cemented carbide;
    and wherein said PVD layer has a residual compressive stress.

2. The method of machining according to claim 1 wherein said predetermined speed is at least 300 surface feet/minute.

3. The method of machining according to claim 1 wherein said predetermined speed is at least 400 surface feet/minute.

4. The method of machining according to claim 1 wherein said alloy being machined is a titanium alloy.

5. The method of machining according to claim 2 wherein said alloy being machined is a titanium alloy.

6. The method of machining according to claim 3 wherein said alloy being machined is a titanium alloy.

7. The method of machining according to claim 1 wherein said alloy being machined is a nickel base high temperature superalloy.

8. The method of machining according to claim 2 wherein said alloy being machined is a nickel base high temperature superalloy.

9. The method of machining according to claim 3 wherein said alloy being machined is a nickel base high temperature superalloy.

10. The method of machining according to claim 1 wherein said alloy being machined is a cobalt based high temperature superalloy.

11. The method of machining according to claim 2 wherein said alloy being machined is a cobalt based high temperature superalloy.

12. The method of machining according to claim 3 wherein said alloy being machined is a cobalt based high temperature superalloy.

13. The method of machining according to claim 1 wherein said alloy being machined is a powder metal based high temperature superalloy.

14. The method of machining according to claim 2 wherein said alloy being machined is a powder metal based high temperature superalloy.

15. The method of machining according to claim 3 wherein said alloy being machined is a powder metal based high temperature superalloy.

16. The method of machining according to claim 1 wherein said inner CVD layer includes a layer of titanium nitride adjacent to said cemented carbide.

17. The method of machining according to claim 16 wherein said inner CVD layer further includes a layer of titanium carbonitride.

18. The method according to claim 1 wherein said cobalt forms 5 to 7 weight percent of said cemented carbide and said inner CVD layer consists of titanium nitride and titanium carbonitride.

* * * * *